(12) United States Patent
Van Der Hoeven (10) Patent No.: US 10,061,207 B2
(45) Date of Patent: Aug. 28, 2018

(54) METHOD FOR PREVENTING OR REDUCING CONTAMINATION OF AN IMMERSION TYPE PROJECTION APPARATUS AND AN IMMERSION TYPE LITHOGRAPHIC APPARATUS

(71) Applicant: ASML Netherlands B.V., Veldhoven (NL)

(72) Inventor: Jan Cornelis Van Der Hoeven, Veldhoven (NL)

(73) Assignee: ASML NETHERLANDS B.V., Veldhoven (NL)

(*) Notice: Subject to any disclaimer, the term of this patent is extended or adjusted under 35 U.S.C. 154(b) by 261 days.

(21) Appl. No.: 14/746,605

(22) Filed: Jun. 22, 2015

(65) Prior Publication Data
US 2015/0286152 A1    Oct. 8, 2015

Related U.S. Application Data

(63) Continuation of application No. 13/188,148, filed on Jul. 21, 2011, now abandoned, which is a continuation of application No. 11/292,311, filed on Dec. 2, 2005, now Pat. No. 8,125,610.

(51) Int. Cl.
  *G03F 7/20* (2006.01)
  *G03F 1/82* (2012.01)

(52) U.S. Cl.
  CPC ...... *G03F 7/70341* (2013.01); *G03F 7/70916* (2013.01); *G03F 7/70925* (2013.01); *G03F 1/82* (2013.01)

(58) Field of Classification Search
  CPC ............. G03F 7/70925; G03F 7/70916; G03F 7/70341

USPC .......................................................... 355/30
See application file for complete search history.

(56) References Cited

U.S. PATENT DOCUMENTS

| | | | |
|---|---|---|---|
| 4,346,164 A | 8/1982 | Tabarelli et al. | |
| 4,480,910 A | 11/1984 | Takanashi et al. | |
| 4,509,852 A | 4/1985 | Tabarelli et al. | |
| 5,314,509 A | 5/1994 | Kato et al. | |
| 5,528,118 A | 6/1996 | Lee | |
| 5,610,683 A | 3/1997 | Takahashi | |
| 5,623,853 A | 4/1997 | Novak et al. | |
| 5,715,039 A | 2/1998 | Fukuda et al. | |

(Continued)

FOREIGN PATENT DOCUMENTS

| | | |
|---|---|---|
| CN | 1963673 | 5/2007 |
| DE | 221563 A1 | 4/1985 |

(Continued)

OTHER PUBLICATIONS

Preliminary Amendment filed Jun. 6, 2008 for U.S. Appl. No. 12/134,950.

(Continued)

*Primary Examiner* — Hung Henry Nguyen
(74) *Attorney, Agent, or Firm* — Pillsbury Winthrop Shaw Pittman LLP (57) ABSTRACT

A method for preventing or reducing contamination of an immersion type projection apparatus is provided. The apparatus includes at least one immersion space that is at least partially filled with a liquid when the apparatus projects a beam of radiation onto a substrate. The method includes rinsing at least part of the immersion space with a rinsing liquid before the apparatus is used to project the beam of radiation onto a substrate.

14 Claims, 4 Drawing Sheets

(56) References Cited

U.S. PATENT DOCUMENTS

| | | |
|---|---|---|
| 5,825,043 A | 10/1998 | Suwa |
| 5,874,820 A | 2/1999 | Lee |
| 5,969,441 A | 10/1999 | Loopstra et al. |
| 6,268,904 B1 | 7/2001 | Mori et al. |
| 6,414,744 B1 | 7/2002 | Kuiper et al. |
| 6,496,257 B1 | 12/2002 | Taniguchi et al. |
| 6,778,257 B2 | 8/2004 | Bleeker et al. |
| 6,844,206 B1 | 1/2005 | Phan et al. |
| 7,050,146 B2 | 5/2006 | Duineveld et al. |
| 7,091,502 B2 | 8/2006 | Gau et al. |
| 7,199,858 B2 | 4/2007 | Lof et al. |
| 7,224,427 B2 | 5/2007 | Chang et al. |
| 7,224,434 B2 | 5/2007 | Tokita |
| 7,301,607 B2 | 11/2007 | Hazelton et al. |
| 7,307,263 B2 | 12/2007 | Bakker et al. |
| 7,315,033 B1 | 1/2008 | Pawloski et al. |
| 7,385,670 B2 | 6/2008 | Compen et al. |
| 7,388,649 B2 | 6/2008 | Kobayashi et al. |
| 7,405,417 B2 | 7/2008 | Stevens et al. |
| 7,462,850 B2 | 12/2008 | Banine et al. |
| 8,125,610 B2 | 2/2012 | Van Der Hoeven |
| 2001/0037858 A1 | 11/2001 | Taniyama et al. |
| 2003/0066975 A1 | 4/2003 | Okada |
| 2003/0068579 A1 | 4/2003 | Takahashi et al. |
| 2004/0160582 A1 | 8/2004 | Lof et al. |
| 2004/0165159 A1 | 8/2004 | Lof et al. |
| 2004/0189964 A1 | 9/2004 | Nijmeijer et al. |
| 2004/0207828 A1 | 10/2004 | Miyajima |
| 2004/0211920 A1 | 10/2004 | Derksen et al. |
| 2004/0263809 A1 | 12/2004 | Nakano |
| 2005/0007567 A1 | 1/2005 | Pierrat et al. |
| 2005/0018208 A1 | 1/2005 | Levinson |
| 2005/0024609 A1 | 2/2005 | De Smit et al. |
| 2005/0025108 A1 | 2/2005 | Dillinger et al. |
| 2005/0030511 A1 | 2/2005 | Auer-Jongepier et al. |
| 2005/0036121 A1 | 2/2005 | Hoogendam et al. |
| 2005/0037269 A1 | 2/2005 | Levinson |
| 2005/0041233 A1 | 2/2005 | Van Schothorst et al. |
| 2005/0052632 A1 | 3/2005 | Miyajima |
| 2005/0058944 A1 | 3/2005 | Takahashi et al. |
| 2005/0078284 A1 | 4/2005 | Van De Ven et al. |
| 2005/0078286 A1 | 4/2005 | Dierichs et al. |
| 2005/0128445 A1 | 6/2005 | Hoogendam et al. |
| 2005/0140956 A1 | 6/2005 | Kroon et al. |
| 2005/0175776 A1 | 8/2005 | Streefkerk et al. |
| 2005/0179877 A1 | 8/2005 | Mulkens et al. |
| 2005/0185155 A1 | 8/2005 | Kishikawa |
| 2005/0205108 A1 | 9/2005 | Chang et al. |
| 2005/0221234 A1 | 10/2005 | Ito |
| 2005/0225734 A1 | 10/2005 | De Smit et al. |
| 2005/0225735 A1 | 10/2005 | Magome et al. |
| 2005/0253090 A1 | 11/2005 | Gau et al. |
| 2005/0264774 A1 | 12/2005 | Mizutani et al. |
| 2005/0274898 A1 | 12/2005 | Watanabe et al. |
| 2006/0023185 A1 | 2/2006 | Hazelton et al. |
| 2006/0023186 A1 | 2/2006 | Binnard |
| 2006/0028626 A1 | 2/2006 | Chang et al. |
| 2006/0028628 A1 | 2/2006 | Lin et al. |
| 2006/0050351 A1 | 3/2006 | Higashiki |
| 2006/0061747 A1 | 3/2006 | Ishii |
| 2006/0077367 A1 | 4/2006 | Kobayashi et al. |
| 2006/0103813 A1 | 5/2006 | Niwa et al. |
| 2006/0103818 A1 | 5/2006 | Holmes et al. |
| 2006/0121209 A1 | 6/2006 | Baselmans et al. |
| 2006/0132731 A1 | 6/2006 | Jansen et al. |
| 2006/0152696 A1 | 6/2006 | Boogaard et al. |
| 2006/0232757 A1 | 10/2006 | Tani et al. |
| 2006/0250588 A1 | 11/2006 | Brandl |
| 2006/0256316 A1 | 11/2006 | Tanno et al. |
| 2007/0002296 A1 | 1/2007 | Chang et al. |
| 2007/0026345 A1 | 2/2007 | Subramanian et al. |
| 2007/0064210 A1 | 3/2007 | Kobayashi et al. |
| 2007/0064215 A1 | 3/2007 | Dirksen et al. |
| 2007/0076183 A1 | 4/2007 | Hara et al. |
| 2007/0076197 A1 | 4/2007 | Koga |
| 2007/0085989 A1 | 4/2007 | Nagahashi et al. |
| 2007/0091287 A1 | 4/2007 | Chang et al. |
| 2007/0127001 A1 | 6/2007 | Van Der Hoeven |
| 2007/0146657 A1 | 6/2007 | Van Mierlo et al. |
| 2007/0146658 A1 | 6/2007 | Van Mierlo et al. |
| 2007/0159610 A1 | 7/2007 | Shiraishi |
| 2007/0172234 A1 | 7/2007 | Shigemori et al. |
| 2007/0206279 A1 | 9/2007 | Brueck et al. |
| 2007/0229789 A1 | 10/2007 | Kawamura |
| 2007/0242241 A1 | 10/2007 | Nagasaka et al. |
| 2007/0247600 A1 | 10/2007 | Kobayashi et al. |
| 2007/0251543 A1 | 11/2007 | Singh |
| 2007/0253710 A1 | 11/2007 | Kaneyama et al. |
| 2007/0258068 A1 | 11/2007 | Horikawa |
| 2007/0258072 A1 | 11/2007 | Nagasaka et al. |
| 2007/0263182 A1 | 11/2007 | Nakano et al. |
| 2007/0274711 A1 | 11/2007 | Kaneyama et al. |
| 2007/0285631 A1 | 12/2007 | Stavenga et al. |
| 2008/0002162 A1 | 1/2008 | Jansen et al. |
| 2008/0043210 A1 | 2/2008 | Shibuta |
| 2008/0049201 A1 | 2/2008 | Stavenga et al. |
| 2008/0218712 A1 | 9/2008 | Compen et al. |
| 2008/0239260 A1 | 10/2008 | Shiraishi |
| 2008/0246931 A1 | 10/2008 | Nakano et al. |
| 2008/0252865 A1 | 10/2008 | Nagasaka et al. |
| 2008/0273181 A1 | 11/2008 | De Jong et al. |
| 2008/0284990 A1 | 11/2008 | De Jong et al. |
| 2009/0025753 A1 | 1/2009 | De Jong et al. |
| 2009/0027635 A1 | 1/2009 | De Jong et al. |
| 2009/0027636 A1 | 1/2009 | Leenders et al. |

FOREIGN PATENT DOCUMENTS

| | | |
|---|---|---|
| DE | 224448 A1 | 7/1985 |
| EP | 1 429 188 A2 | 6/2004 |
| EP | 1 429 188 A3 | 10/2004 |
| EP | 1 477 856 A1 | 11/2004 |
| EP | 1 531 362 A2 | 5/2005 |
| EP | 1 571 697 A1 | 9/2005 |
| EP | 1 571 699 A1 | 9/2005 |
| EP | 1 610 183 A2 | 12/2005 |
| EP | 1 628 329 A1 | 2/2006 |
| EP | 1 667 211 A1 | 6/2006 |
| EP | 1 672 680 A1 | 6/2006 |
| EP | 1 717 845 A1 | 11/2006 |
| EP | 1 783 821 A1 | 5/2007 |
| EP | 1 895 571 | 3/2008 |
| JP | 57-117238 | 7/1982 |
| JP | 58-202448 | 11/1983 |
| JP | A 59-19912 | 2/1984 |
| JP | 62-65326 | 3/1987 |
| JP | 62-183522 | 8/1987 |
| JP | 63-157419 | 6/1988 |
| JP | 04-065603 | 2/1992 |
| JP | 4-305915 | 10/1992 |
| JP | 4-305917 | 10/1992 |
| JP | A 05-62877 | 3/1993 |
| JP | 06-053120 | 2/1994 |
| JP | 6-124873 | 5/1994 |
| JP | 06-188169 | 7/1994 |
| JP | 07-176468 | 7/1995 |
| JP | 07-220990 | 8/1995 |
| JP | 08-037149 | 6/1996 |
| JP | A 08-166475 | 6/1996 |
| JP | A 08-316125 | 11/1996 |
| JP | A 08-330224 | 12/1996 |
| JP | A 10-163099 | 6/1998 |
| JP | 10-189526 | 7/1998 |
| JP | A 10-214783 | 8/1998 |
| JP | 10-303114 | 11/1998 |
| JP | 10-340846 | 12/1998 |
| JP | 11-016816 | 2/1999 |
| JP | 11-135400 | 5/1999 |
| JP | 11-176727 | 7/1999 |
| JP | 2000-058436 | 2/2000 |
| JP | A 2000-505958 | 5/2000 |
| JP | 2000-323396 | 11/2000 |
| JP | 2001-319849 | 11/2001 |
| JP | 2002-014005 | 1/2002 |

(56) References Cited

FOREIGN PATENT DOCUMENTS

| | | |
|---|---|---|
| JP | A 2002-343698 | 11/2002 |
| JP | 2005-5713 | 1/2005 |
| JP | 2005-072404 | 3/2005 |
| JP | 2005-79222 | 3/2005 |
| JP | 2005-079584 | 3/2005 |
| JP | A 2005-101487 | 4/2005 |
| JP | 2005-136404 | 5/2005 |
| JP | 2005-236047 A | 9/2005 |
| JP | 2005-277363 A | 10/2005 |
| JP | A 2005-277053 | 10/2005 |
| JP | A 2005-294520 | 10/2005 |
| JP | A 2005-353763 | 12/2005 |
| JP | A 2006-5335 | 1/2006 |
| JP | 2006-134999 | 5/2006 |
| JP | 2006-156974 | 6/2006 |
| JP | 2006-310706 | 11/2006 |
| JP | 2007-029973 | 2/2007 |
| JP | 2007-088328 | 4/2007 |
| JP | 2007-142217 | 6/2007 |
| JP | 2007-150102 | 6/2007 |
| JP | 2007-227543 | 9/2007 |
| JP | 2007-227580 | 9/2007 |
| JP | 4938424 | 5/2012 |
| WO | WO 2001/035168 | 12/1996 |
| WO | WO 99/49504 | 9/1999 |
| WO | WO 2004/019128 | 3/2004 |
| WO | WO 2004/051717 | 6/2004 |
| WO | WO 2004/053955 A1 | 6/2004 |
| WO | WO 2004/090577 | 10/2004 |
| WO | WO 2004/093130 A2 | 10/2004 |
| WO | WO 2004/102646 | 11/2004 |
| WO | WO 2004/105107 | 12/2004 |
| WO | WO 2005/022615 | 3/2005 |
| WO | WO 2005/031820 A1 | 4/2005 |
| WO | WO 2005/036623 A1 | 4/2005 |
| WO | WO 2005/071717 | 8/2005 |
| WO | WO 2005/081293 | 9/2005 |
| WO | WO 2005/122218 | 12/2005 |
| WO | WO 2006/041086 | 4/2006 |
| WO | WO 2006/062065 | 6/2006 |
| WO | WO 2006/122578 | 11/2006 |
| WO | WO 2007/005362 | 1/2007 |
| WO | WO 2007/006447 | 1/2007 |
| WO | WO 2007/135990 | 11/2007 |
| WO | WO 2007/136089 | 11/2007 |
| WO | WO 2008/001871 | 1/2008 |

OTHER PUBLICATIONS

Information Disclosure Statement filed Jun. 9, 2008 for U.S. Appl. No. 12/155,714.
Information Disclosure Statement filed Jun. 9, 2008 for U.S. Appl. No. 12/155,742.
Search Report for Singapore Patent Application No. 0608341-4 dated Aug. 12, 2008.
European Search Report issued for European Patent Application No. 06077040.1-2222 dated Apr. 17, 2007.
European Search Report (extended) issued for European Patent Application No. 06077040.1-2222 dated Aug. 30, 2007.
English Translation of Notice of Reasons for Rejection as issued for Japanese Patent Application No. 2006-316939, dated Oct. 15, 2009.
Japanese Office Action from Japanese Patent Application No. 2006-316939, dated Aug. 3, 2010.
Notice of Reasons for Rejection as issued for Japanese Patent Application No. 2006-316939, dated Jun. 2, 2011.
Taiwanese Office Action regarding Taiwanese Patent Application No. 095142866, dated Feb. 18, 2011.
Taiwanese Office Action regarding Taiwanese Patent Application No. 100118723, dated Nov. 13, 2013.
Japanese Office Action regarding Japanese Patent Application No. 2010-006646, dated Jun. 28, 2012.
European Office Action dated Dec. 22, 2016 in corresponding European Patent Application No. 06 077 040.1.

METHOD FOR PREVENTING OR REDUCING CONTAMINATION OF AN IMMERSION TYPE PROJECTION APPARATUS AND AN IMMERSION TYPE LITHOGRAPHIC APPARATUS

This application is a continuation of co-pending U.S. patent application Ser. No. 13/188,148, filed Jul. 21, 2011, which is a continuation of U.S. patent application Ser. No. 11/292,311, filed Dec. 2, 2005 and issued on Feb. 28, 2012 as U.S. Pat. No. 8,125,610, both of which are incorporated herein their entireties by reference.

FIELD

The present invention relates to a method for preventing or reducing contamination of an immersion type projection apparatus. The present invention also relates to an immersion type lithographic apparatus.

BACKGROUND

A known projection apparatus is a lithographic apparatus. A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of one, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to utilize immersion lithography, for example using an immersion type lithographic apparatus. As an example, it has been proposed to immerse the substrate in a lithographic projection apparatus in an immersion liquid having a relatively high refractive index, e.g. water, so as to fill the space between the final optical element of the projection lens and the substrate. The point of this is to enable imaging of smaller features because the exposure radiation will have a shorter wavelength in the liquid than in air or in a vacuum. (The effect of the liquid may also be regarded as increasing the effective NA of the system).

Submersing the substrate or substrate and substrate table in a bath of liquid (see for example U.S. Pat. No. 4,509,852) means that there is a large body of liquid that must be accelerated during a scanning exposure. This may require additional or more powerful motors and turbulence in the liquid may lead to undesirable and unpredictable effects.

It has also been proposed to apply a liquid supply system to provide liquid on only a localized area of the substrate and in between the final optical element of the projection system and the substrate (the substrate generally has a larger surface area than the final optical element of the projection system). Ways which have been proposed to arrange for this are disclosed, for example, in WO 99/49504 and EP 1 429 188 A2.

SUMMARY

It is desirable to prevent or reduce contamination in an immersion type projection apparatus.

According to an embodiment of the invention, there is provided a method for preventing or reducing contamination of an immersion type projection apparatus. The apparatus includes at least one immersion space that is at least partially filled with a liquid when the apparatus projects a beam of radiation onto a substrate. The method includes rinsing at least part of the immersion space with a rinsing liquid before the apparatus is used to project the beam of radiation onto a substrate.

According to another embodiment, there is provided a method for preventing or reducing contamination of a lithographic projection apparatus. The apparatus includes a substrate holder constructed to hold a substrate, a patterning device holder constructed to hold a patterning device, a projection system, and an immersion system configured to at least partially fill an immersion space of the apparatus with a liquid. The method includes moving at least one of the immersion system and at least part of the apparatus relative to each other, and rinsing the at least part of the apparatus with the liquid before the apparatus is used to project a patterned beam of radiation onto a target portion of a substrate.

According to another embodiment, there is provided a method for preventing or reducing contamination of a lithographic projection apparatus. The apparatus includes an immersion space. The method includes filling at least part of the immersion space with a rinsing liquid for at least one minute.

According to an embodiment, there is provided a method for preventing or reducing contamination of a lithographic projection apparatus. The apparatus includes a substrate holder constructed to hold a substrate, a patterning device holder constructed to hold a patterning device, a projection system, and an immersion space. The method includes filling at least part of the immersion space with a rinsing liquid during an idle time of the apparatus to prevent or reduce substrate contamination during at least one subsequent start-up run of the apparatus.

According to an embodiment, there is provided an immersion type lithographic apparatus that includes at least one immersion space, and an immersion system configured to at least partially fill the immersion space with a liquid. The apparatus is configured to rinse at least part of the immersion space with a rinsing liquid before the apparatus is used to project a patterned beam of radiation onto a substrate.

According to an embodiment, there is provided an immersion type lithographic apparatus that includes at least one storage space or compartment to store at least one dummy substrate or substrate shaped object in-situ.

According to an embodiment, there is provided an immersion type lithographic apparatus that includes at least one storage space or compartment to store at least one dummy patterning device or patterning device shaped object in-situ.

According to an embodiment, there is provided a computer program containing one or more sequences of machine-readable instructions configured to carry out a method for preventing or reducing contamination of an immersion type projection apparatus when the computer program is being executed by a computer. The apparatus includes at least one immersion space that is at least partially filled with a liquid when the apparatus projects a beam of radiation onto a substrate. The method includes rinsing at least part of the immersion space with a rinsing liquid before the apparatus is used to project the beam of radiation onto a substrate.

According to an embodiment, there is provided a method for preventing or reducing contamination of a lithographic projection apparatus. The apparatus includes a space that is to be provided with a liquid through which a beam of radiation can be transmitted. The method includes operating the lithographic apparatus, and subsequently rinsing at least part of the space with a rinsing liquid.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

In the present application, the same or similar features are generally denoted by the same or similar reference signs.

Figure 1:
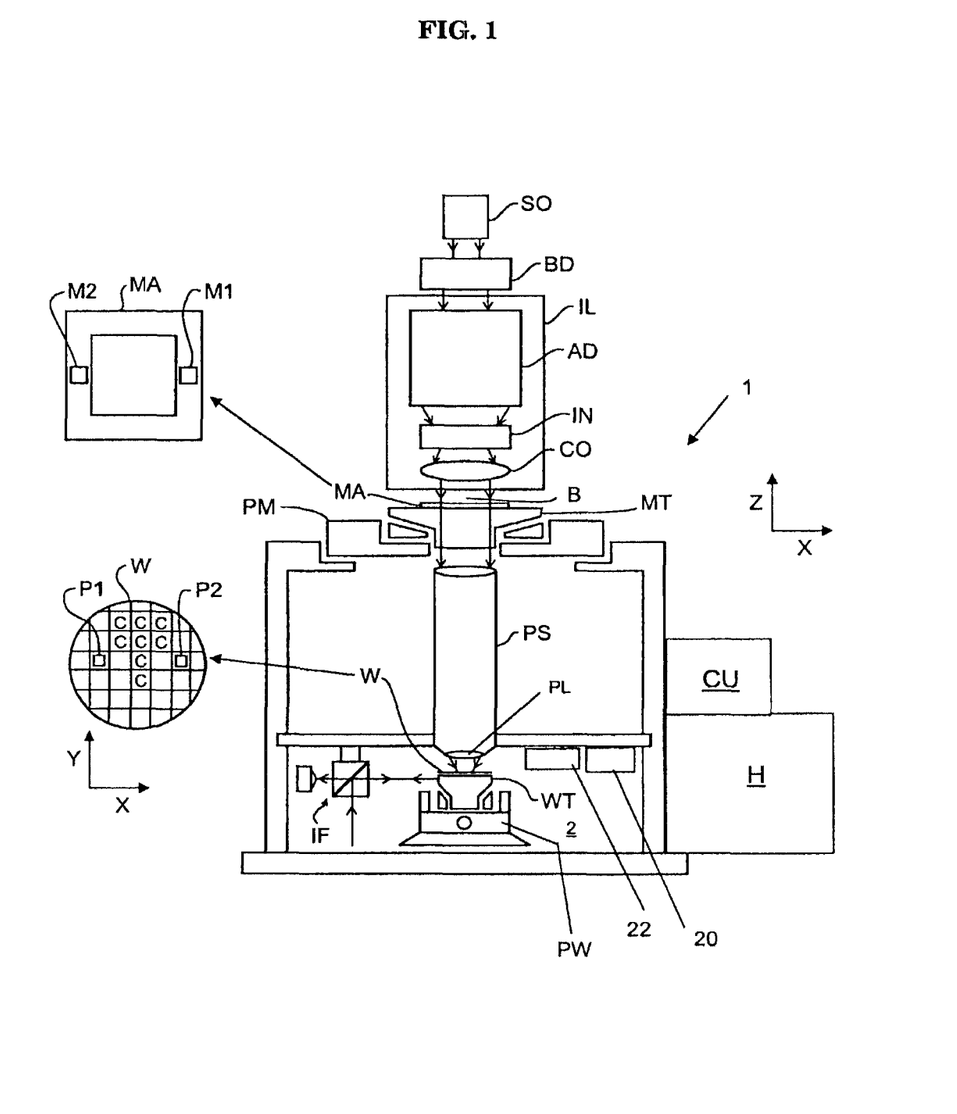
FIG. 1 depicts a lithographic apparatus according to an embodiment of the invention.

FIG. 1 schematically depicts a projection apparatus 1 according to one embodiment of the invention.

According to an embodiment of the invention, the apparatus 1 is a lithographic apparatus, and is arranged to project a pattern from a patterning device MA onto a substrate W.

The apparatus can comprise: an illumination system (illuminator) IL configured to condition a radiation beam B (e.g. UV radiation or an other type of radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
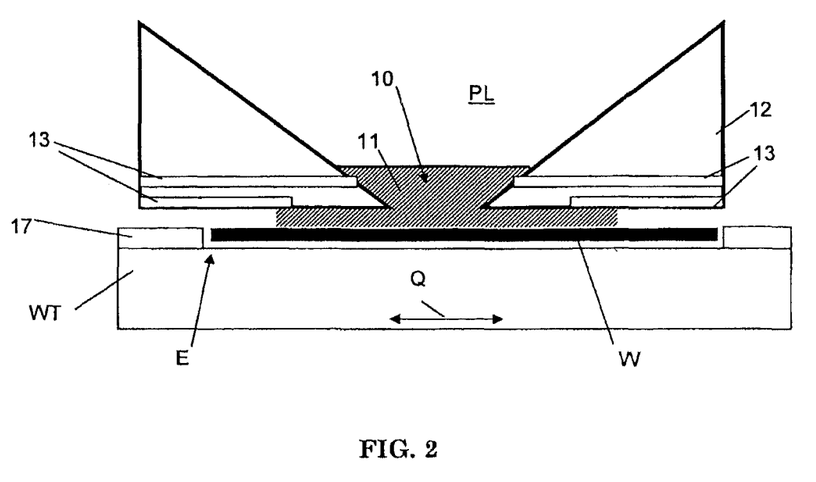
FIG. 2 schematically depicts a detail of the embodiment of FIG. 1.

In an embodiment of the present invention, the projection apparatus 1 is of a type wherein at least a portion of the substrate is covered by a liquid having a relatively high refractive index, e.g. water or an other suitable liquid, so as to fill an immersion space 10 between the projection system and the substrate (see FIG. 2). An immersion liquid may also be applied to other spaces 10' in the lithographic apparatus 1, for example, between the mask MA and the projection system PS (see FIG. 4). Immersion techniques as such are well known in the art for increasing the numerical aperture of projection systems. The term "immersion" as used herein does not mean that a structure, such as a substrate, must be submerged in liquid, but generally only means that liquid is located between the projection system on one side and the substrate and/or mask MA on an opposite side during exposure. For example, the apparatus can have a similar construction as the apparatus described in EP 1 429 188 A2, which has been incorporated in the present application by reference in its entirety, or a different construction.

FIG. 2 shows a detail of the apparatus of FIG. 1. FIG. 2 depicts an immersion space 10 which abuts at least part of a projection system PS. Particularly, in FIG. 2, the immersion space 10 extends between a final optical element PL of the projection system PS and a substrate W or substrate shaped object W, which is positioned on a substrate table WT. The apparatus 1 includes an immersion system, comprising inlet/outlet ducts 13. During use, the immersion system fills the immersion space 10 with a liquid 11 having a relatively high refractive index, e.g. water, via inlet/outlet ducts 13. The liquid has the effect that the radiation of the projection beam has a shorter wavelength in the liquid than in air or in a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture. Furthermore, at fixed numerical aperture, the liquid is effective to increase the depth of field.

The configuration of the apparatus can be such that a substantially contactless seal is formed to the substrate W around the image field of the final optical element PL so that the liquid is confined to fill the space between the substrate's primary surface, which faces the projection system PS, and the final optical element PL of the projection system PS. A reservoir, providing the immersion space 10, can be formed by a seal member 12, for example an 'immersion hood', positioned below and surrounding the final optical element PL of the projection system PS. Thus, the immersion system can be arranged to provide immersion liquid on only a localized area of the substrate W. The seal member 12 can form part of the liquid supply system for filling the space between the final optical element PL of the projection system PS and the substrate W with a liquid. This liquid is brought into the space below the final optical element PL and within the seal member 12. The seal member 12 preferably extends a little above the final optical element PL of the projection system PS and the liquid rises above the final optical element PL so that a buffer of liquid is provided. The seal member 12 can have an inner periphery that at the upper end closely conforms to the shape of the projection system PS or the final optical element PL thereof and may, e.g. be round. At the bottom the inner periphery closely conforms to the shape of the image field, e.g. rectangular, though this is not necessarily so. The seal member 12 can be substantially stationary in the XY plane relative to the projection system PS though there may be some relative movement in the Z direction (in the direction of the optical axis). A seal can be formed between the seal member 12 and the surface of the substrate W, to confine immersion liquid 11 in the immersion space 10. This seal is preferably a contactless seal and may be a gas seal (not shown).

Also, the substrate table WT can be provided with a cover plate or edge seal member 17. Such an edge seal member 17 can have an upper (as illustrated) primary surface substantially co-planar with the upper primary surface of substrate W and is closely adjacent to the edge of the substrate W so that there is no sudden loss of liquid as the edge of the substrate moves under the final optical element PL. Some liquid loss into the gap may still occur.

Of course there are arrangements in which the whole construction illustrated in FIG. 2 is positioned upside down so that it is the lower surfaces of the edge seal member and the substrate which face the projection system and which are substantially co-planar. The surfaces are therefore be referred to as the primary surfaces which face the projection system PS rather than upper surfaces. References herein to upper surfaces and lower surfaces may be also appropriately considered as references to lower and upper surfaces respectively in an upside-down configuration.

With such an apparatus, a liquid supply system (e.g. immersion space 10) can be positioned over the edge of the substrate W and can even be moved completely off the substrate W. This enables edge portions of the substrate W to be imaged during a device manufacturing method, carried out by the apparatus.

The edge seal member 17 can be provided in various ways, and may, for example, form an integral part of the substrate table WT or may be temporarily mounted relative to the remainder of the substrate table by the use of, for example, vacuum suction or through use of electromagnetic forces. Also, the edge seal member 17 may be formed of several individual segments, each of which surrounds a portion of the edge of the substrate W.

According to an embodiment, the projection apparatus comprises at least one said immersion space 10 and a respective immersion system which is configured to at least partially fill the immersion space 10 with an immersion liquid 11. The apparatus can be configured to rinse at least part of the immersion space 10 with a rinsing liquid 11 before the apparatus is used to project the patterned beam of radiation onto a substrate W. For example, in an embodiment, the apparatus is being configured to rinse at least part of the immersion space during a relatively long idle operational mode of the apparatus. The apparatus can be configured to rinse the immersion space substantially continuously until the apparatus projects a patterned radiation beam onto a substrate.

It is advantageous when the apparatus is configured to rinse the immersion space with said immersion liquid 11. Then, the immersion liquid and rinsing liquid are simply the same liquid 11, so that the apparatus does not have to be provided with a special cleaning device to supply a particular cleaning liquid to the immersion space.

In an embodiment, the apparatus can be configured to provide an object in said immersion space 10 and/or in an adjoining position with respect to the immersion space 10 during the rinsing of that space 10, and to remove said object before the apparatus is used to project a patterned radiation beam onto a target portion of a substrate. Said object can include, for example, a virgin (non-coated) wafer, a dummy wafer or a wafer shaped object. For example, as is shown in FIG. 1, the apparatus can include at least one storage space or compartment 22, H to store said object when the apparatus is used to project a patterned radiation beam onto a target portion of a normal (resist coated) substrate. Said storage space or compartment 22, H can be provided at various different locations of or near the apparatus. For example, such a storage space or compartment can be located in or near the substrate stage 2 of the apparatus, as has been schematically depicted by box 22 in FIG. 1. Such a storage space or compartment can be arranged in various ways, and can include a closable container, a substrate storage box, a substrate robot gripper or any other suitable substrate holder or substrate storing means. Such a storage space or compartment is preferably located within the apparatus 1, for example near said immersion system (in substrate handler is described in the following).

Alternatively, said storage space or compartment can include or be part of a substrate handler H, which is located outside the substrate stage 2 of the apparatus 1. Such a substrate handler H as such is known to the skilled person. Usually, such a substrate handler H can be configured to receive one or more substrates from an environment of the apparatus 1, to temporarily store the one or more substrates and to transfer the one or more substrates to the substrate support WT, to be subsequently illuminated by the projection system PS. In the present embodiment, for example, the substrate handler H can be configured to hold or store one or more substrates, dummy substrates and/or substrate shaped objects during a desired period of time, before such a substrate, dummy substrate and/or substrate shaped object is located on a respective substrate table WT during a rinsing process, for example during an idle operational period of the apparatus 1.

Besides, the apparatus 1 can include a mechanism (not specifically shown) which is arranged or configured to transfer substrates W from such a storage space or compartment 22, H to a substrate holder WT, and vice-versa. Such a mechanism is known to the skilled person. For example, the substrate handler H and substrate support WT can be arranged or configured in various ways to transfer substrates therebetween. For example, one or more robot arms, conveyors, transport means or other transfer mechanisms can be provided to move substrates, dummy substrates or substrate shaped objects from and to desired substrate positions.

Further, the apparatus can include at least one ultra violet radiation source to illuminate the immersion space 10 with ultraviolet radiation during the rinsing of that space, before the apparatus is actually used to transfer a patterned radiation beam onto a normal (resist coated) substrate. For example, the above-mentioned radiation source SO may be arranged and configured to be such an ultra violet radiation source. On the other hand, one or more different radiation sources can be provided to illuminate the immersion space 10 with ultraviolet radiation during the rinsing.

Figure 3:
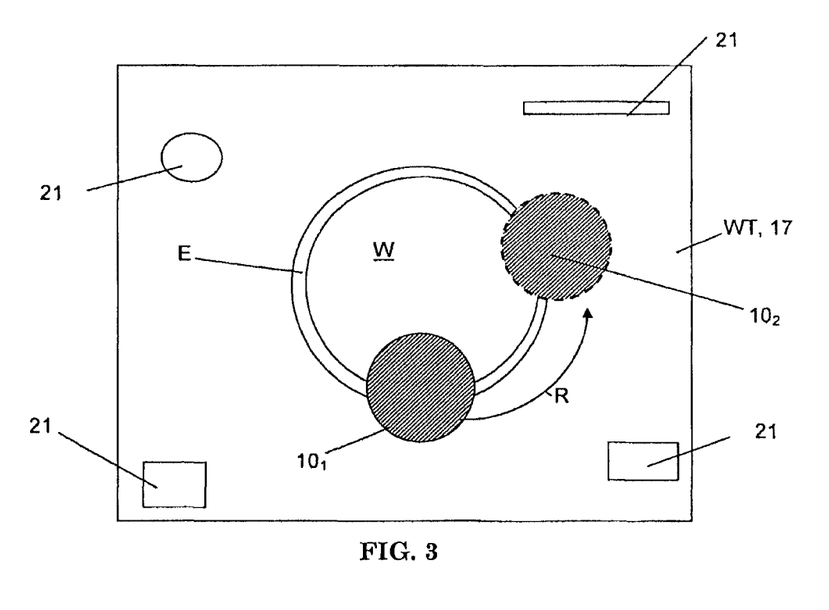
FIG. 3 schematically depicts a top view of a substrate and a substrate support of the embodiment of FIG. 1, showing different immersion space locations.

In the embodiment shown in the FIGS. 1 and 2, said immersion space 10 can extend between at least part of a substrate, a dummy substrate, a substrate-shaped object W and/or substrate table or holder WT, 17 on one side and a projection system PS on an opposite side during use. Said dummy substrate can be, for example, a bare silicon wafer, which has not been provided with a resist coating layer. For example, as has been mentioned above, the apparatus can be configured to place a dummy substrate or a substrate-shaped object on said substrate holder WT, and to subsequently rinse the respective immersion space 10. Also, the apparatus can be configured to have the immersion space 10 at least reach or include an outer contour of a substrate, dummy substrate or substrate-shaped object W, being held by said substrate holder WT, during the rinsing. This is shown in FIG. 3. For example, the apparatus can be configured to rinse at least an area of the substrate support WT (using said rinsing liquid), which area extends along and/or around an edge of a substrate, dummy substrate or substrate-shaped object, being held by the substrate holder WT. In that case, relatively low particle per substrate counts can be obtained when the apparatus is used subsequently to illuminate normal substrates as part of a lithography process. For example, the apparatus can be configured to rinse at least part of a surface of the substrate holder WT and/or at least part of a surface of the substrate edge seal member 17 of the substrate holder WT, using said immersion space 10 and said rinsing liquid.

Besides, in an embodiment, the apparatus can be configured to move said substrate holder WT with respect to said projection system PS during the rinsing or cleaning process, such that the position of the immersion space 10 changes with respect to the substrate holder during the rinsing. This is shown in FIGS. 2 and 3 by arrows Q and R. In FIG. 2, the arrow Q indicated a lateral movement of the substrate holder WT with respect to the projection system PS and immersion space 10.

In FIG. 3, the arrow R indicates the scanning of the immersion space 10 along an edge of the substrate or substrate shaped object W, circumferentially with respect to the substrate or substrate shaped object W, from a first position $10_1$ of the immersion space 10 to a second position $10_2$. In this way, the inner part of the surface of the substrate holder WI, or of the respective substrate edge seal member 17, that extends near a substrate W during a lithography use of the apparatus, can be rinsed with rinsing liquid. Also, in this way, contamination can be removed from an edge slit E extending between the substrate or substrate shaped object W on one side and the substrate holder, or optional edge seal member 17, on an opposite side relatively well.

Besides, the surface of the substrate holder WT surrounding the substrate W during use can include other components 21, such as sensors, positioning devices, mirror elements and/or other components, as has been schematically depicted in FIG. 3. In an embodiment of the invention, the scanning of the immersion space is such, that those components 21 can also be reached by the immersion system, to rinse the outer surfaces of these components 21.

Movement of the substrate holder WT to scan the immersion space 10 with respect to the substrate holder WT can be carried out in various directions, for example in the directions Q, R as shown in FIGS. 2 and 3 and/or in various other scanning directions, as will be clear to the skilled person.

In an embodiment of the invention, the apparatus is configured to start said rinsing automatically after a predetermined amount of idle time of the apparatus. Also, the apparatus can be configured to start said rinsing automatically after a predetermined number of lithographic substrate exposures (when a patterned radiation beam is being projected onto the substrates). Moreover, in an embodiment, the apparatus can be configured to determine or estimate whether at least part of said apparatus has reached a certain threshold amount of contamination, and to rinse said apparatus part when it has been determined or estimated that that apparatus part has reached the threshold amount of contamination. Besides, as has been shown schematically in FIG. 1, the apparatus can comprise a computer control CU to control the apparatus, or to at least control said rinsing. Such a computer control CU can be configured, for example, to control the timing of the starting of the rinsing process, to count numbers of substrate exposures in order to start the rinsing process and/or to estimate or determine when a certain apparatus part has reached said threshold amount of contamination. The computer control can be provided by suitable computer software. For example, an embodiment of the invention provides a computer program containing one or more sequences of machine-readable instructions which are configured to carry out a method as disclosed in this patent application, when the computer program is being executed by a computer.

Figure 4:
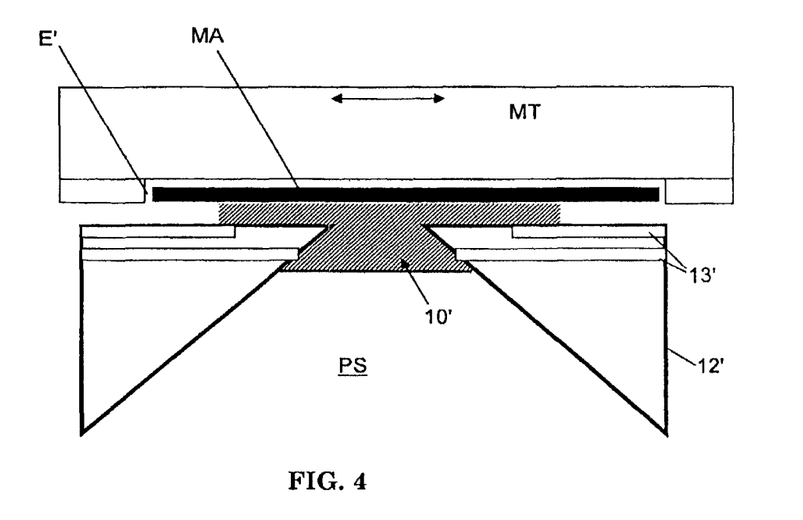
FIG. 4 shows a detail of an alternative embodiment.

In an alternative embodiment, schematically depicted in FIG. 4, the immersion space 10' formed by a seal member 12' and filled via inlet/outlet ducts 13' can extend at least between a patterning device MA and/or patterning device holder MT on one side and the projection system on an opposite side. In that case, for example, the apparatus can be configured to place a dummy patterning device or a patterning device shaped object on said patterning device holder MT, and to subsequently rinse the respective immersion space 10'. It will be clear that the apparatus can also include an immersion space at the wafer stage and an immersion stage at the patterning device stage, for example by combining the embodiments of FIGS. 2 and 4.

Also, in an embodiment, the apparatus can include at least two substrate holders WT. Then, the apparatus can be configured to move each substrate holder WT at least to a first position, wherein said immersion space extends between at least part of the substrate holder WT on one side and the projection system PS on an opposite side, and to a respective second position, away from said projection system PS. Said second position can be, for example, near said substrate handler H, to transfer substrates between the respective substrate holder and the substrate handler H (see FIG. 1). According to a further embodiment, the apparatus can be configured to subsequently move said various substrate holders WT to said first position, to be at least partially rinsed in or near that position by said rinsing liquid. Alternatively, the apparatus can comprise one or more cleaning devices which are configured to at least partially clean a substrate holder when that substrate holder is in said second position. Such a cleaning device 20 is schematically depicted in FIG. 1, and may be arranged, for example to rinse a substrate holder with rinsing fluid when the substrate holder is in or near said second position. Such a cleaning device 20 can function similarly to said immersion system, by creating and applying a respective immersion space, or in a different way. Besides, such a cleaning device 20 might be arranged to immerse a respective substrate holder completely in a suitable cleaning liquid.

Besides, the apparatus can be configured to determine which of said various substrate holders is most likely to be contaminated and is to be rinsed or cleaned first, wherein the apparatus is configured to rinse or clean that substrate holder first which is found to be most likely to be contaminated.

During use, the immersion type projection apparatus shown in FIGS. 1-3 can carry out a method for preventing or reducing contamination. To that aim, at least part of the immersion space 10 is being rinsed with a rinsing liquid, preferably being said immersion liquid, before the apparatus is used to project the patterned beam of radiation onto a resist coated substrate. As follows from the above, the immersion space 10 can simply be rinsed substantially continuously during an idle operational mode of the apparatus, until the apparatus is used to carry out a lithography process to transfer a patterned radiation beam onto a target portion of a substrate. Optionally, at least part of the immersion space and/or the rinsing liquid is being illuminated by ultraviolet radiation, for example to disable or kill bacteria. In one embodiment, the immersion liquid can be transformed into an ultrasonic cleaning bath. In an other embodiment, the immersion liquid is not transformed into an ultrasonic cleaning bath, i.e. an embodiment wherein the apparatus 1 does not include an ultrasonic transmitter configured to turn immersion liquid into an ultrasonic cleaning liquid.

Said idle operational mode of the apparatus 1 can include various idle times. For example, the apparatus can be idle in a device manufacturing plant due to various circumstances, such as the instantaneous substrate throughput of the plant, a temporary halt in the supply of substrates to the apparatus 1, a downtime of the plant, a certain maintenance period of the apparatus and/or a different period.

As is shown in FIGS. 2 and 3, a dummy substrate or a substrate-shaped object W can be provided on said substrate holder WT when the immersion space is being rinsed with said rinsing liquid, for example to rinse at least part of the substrate holder WT. For example, during use, before staring the rinsing, said dummy substrate or substrate shaped object W can be transferred from the in-situ compartment 22, or alternatively from the substrate handler H, to the substrate holder WT.

Also, the substrate holder WT can be provided with said edge seal member 17. In that case, an upper surface, or part thereof, of the edge seal member 17 of the substrate holder WT can be rinsed by the immersion system.

After such rinsing, the dummy substrate or the substrate-shaped object can be replaced by a true substrate which is to be illuminated by the projection system PS in a lithography manufacturing method. For example, the dummy substrate or substrate shaped object W can be stored in a suitable storage compartment, for example said in-situ compartment 22 or said substrate handler H, during said lithography manufacturing method. After the lithography manufacturing method, for example, when the apparatus is being put into a relatively long idle operational mode, the dummy substrate or substrate shaped object can again be placed onto the substrate holder WT, and the substantially continuous rinsing can be repeated.

Also, the location of the immersion space 10 can be being varied during the rinsing treatment. For example, the apparatus can move the substrate holder WT with respect to the immersion system and/or projection system PS, such that the immersion space 10 can subsequently reach different locations of the substrate holder (and/or substrate edge seal 17 or other components 21), to remove contamination therefrom. In this way, at least part of the apparatus can be washed or rinsed by the immersion system, preferably simply using the immersion liquid which is also used during lithography use of the apparatus. As follows from the above, in an embodiment, the immersion system can wash or rinse at least one slit or aperture E extending in or near the substrate holder WT, particularly said edge slit E extending between the substrate or substrate shaped object W on one side and the substrate holder, or optional edge seal member 17, on an opposite side relatively well.

In an embodiment, the immersion space is at least partially being filled or flushed with a rinsing liquid, preferably said immersion liquid, for example for at least one minute, at least one hour, or a different time period. For example, the immersion space 10 can at least partially be filled or flushed with a rinsing liquid substantially continuously for at least one day, including at least one idle operational period or part thereof. Also, different rinsing periods can be utilized, if desired. Also, the immersion space 10 can be at least partially being filled or flushed with a rinsing liquid during an idle time of the apparatus, to prevent or reduce substrate contamination during at least one subsequent start-up run of the apparatus. Besides, the method can include circulating an immersion liquid through an immersion space of the apparatus. To provide a substantially contamination free immersion liquid, the immersion liquid can be filtered and/or treated in a suitable manner, as will be clear to the skilled person.

When the apparatus includes at least two substrate holders WT, see for example European Patent Application No. 03257072.3, the substrate holders WT might be moved subsequently to said first position, to be cleaned by the immersion system. Alternatively, one or more of those substrate holders might be cleaned by said optional cleaning device 20, when that substrate holder is in said second position. Also, during idle time, one or more of the substrate holders might be submerged completely in a suitable liquid, to clean the holder and/or to keep the holder uncontaminated. Besides, the computer control CU and/or the software may determine which of said various substrate holders is most likely to be contaminated and is to be rinsed or cleaned, or submerged, first.

In an alternative method, as has been described above and has been depicted in FIG. 4, a respective immersion space 10' at least extends between a patterning device, a dummy patterning device or a patterning device shaped object MA and/or patterning device holder MT on one side and a projection system PS on an opposite side. For example, a dummy patterning device or a patterning device shaped object MA can be placed on the patterning device holder MT, whereafter the respective immersion space 10' is being rinsed, for example during idle mode of the apparatus. Preferably, the apparatus includes an in-situ storage space or compartment (not shown) to store such a dummy patterning device or a patterning device shaped object MA, when that patterning device or object is not being located on the patterning device holder. After the rinsing, the dummy patterning device or the patterning device shaped object can be replaced by a true patterning device, which is to be used to pattern radiation before the radiation enters the projection system PS. For example, the immersion system can wash or rinse at least part of the patterning device holder. Also, the immersion system can wash or rinse at least one slit or aperture E' extending in or near the patterning device holder WT (see FIG. 4). In case the apparatus includes at least two patterning device holders, the various patterning device holders can be treated similarly to the above-described method for preventing or reducing contamination with respect to multiple substrate holders WT.

In case the apparatus 1 includes at least two patterning device supports MT, the supports MT might be moved subsequently to respective first position, to be cleaned by the respective immersion system, similar to the above described treatment of at least two substrate holders WT. Also, one or more of those patterning device supports MT might be cleaned by an optional cleaning device (not shown), when those supports MT are in respective second positions, Besides, the computer control CU and/or the software may determine which of said various patterning device supports MT is most likely to be contaminated and is to be rinsed or cleaned first.

The invention can be aimed at reducing contamination during start-up of the lithographic apparatus and/or reducing contamination on the first substrate(s) of a batch of substrates. For example, the first substrates being processed by the apparatus after a machine idle time may show a contamination peak, for example in the number of particles. Said number can be expressed as the "Particle per Wafer Pass" (PWP) number. Besides, the invention can achieve a reduction of potential bacteria growth. For example, said rinsing can provide a continuous flow of fluid over a respective apparatus part (for example a substrate holder), which can prevent bacteria growth. Besides, by applying the optional in-situ UV-light cleaning procedure, the utilization of a $H_2O_2$ cleaning method to remove bacteria can be avoided. The use of $H_2O_2$ is not compatible with TiN, which might be present in certain components of the apparatus.

Figure 5:
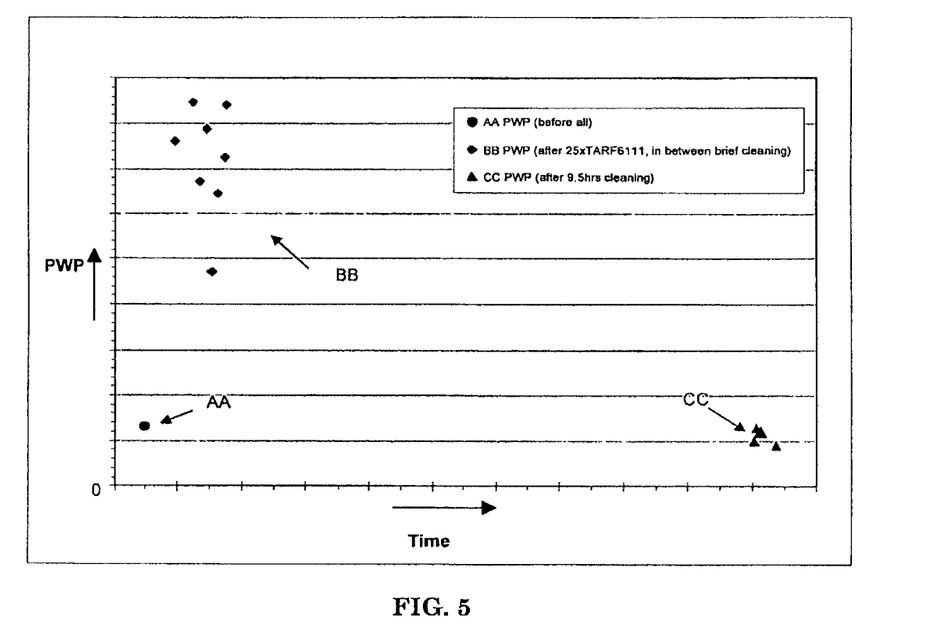
FIG. 5 shows results, concerning particle counts of different test runs.

Usually, in a device manufacturing method, resist coated wafers are to be illuminated by the apparatus. The use of resist coated wafers may increase the contamination level PWP, depending for example on the resist and the way it is applied to the substrate. This has been depicted in FIG. 5. FIG. 5 shows results of different experimental test runs concerning the substrate stage of the immersion type apparatus. First, a PWP value was being determined using a bare silicon wafer, which had been loaded and unloaded to and from the substrate holder WT of the apparatus. The respective value was relatively low, and has been plotted by a circle AA in FIG. 5.

Shortly after that, a batch of resist coated wafers (zero dose) was exposed by the apparatus. Next, the PWP was again tested, using a further 8 bare Si wafers. The respective 8 results, depicted in FIG. 5 by diamonds BB, show an increase of the PWP.

Then, the rinsing of the immersion space was started, utilizing the immersion system and immersion liquid, during a subsequent idle period of the apparatus of about 9 ½ hrs. After that, a further 5 bare wafers were used to test the PWP again. Their results, depicted by triangles CC in FIG. 5, shown that the rinsing of the immersion space 10 led to a desired low PWP Particularly, the PWP of a first wafer to be exposed in an operational period of the apparatus can typically be much higher than of any subsequently exposed wafers. Following the present invention, prolonged or substantially continuous wet hovering by the immersion system over the substrate holder WT and/or patterning device holder MT, and/or parts thereof such as said edge seal member 17, slits E, E', sensors and other components, has been demonstrated to reduce the PWP.

In an embodiment, the apparatus can be configured to load bare silicon wafers on the substrate holder or substrate holders (or chucks of parts thereof), and to start wet hovering over the substrate holder(s). For example, such a rinsing can be carried out with a minimal number of Closing Disk Exchanges, in case the apparatus has been provided with a so called closing disk or suitable closing member to close fluid supplies 13 of said immersion system. The rinsing procedure can be started automatically after a given time of "machine idle" (compare with a "screen-saver"), and/or after a certain number of exposures. For example, a number of virgin wafers stored in a "pizza box shaped container" in the Wafer Handler H, or in a different location, can be used for such cleaning actions.

When the apparatus includes two or more substrate holders or chucks, each of the substrate holders or chucks may be cleaned by swapping the substrate holders or chucks after a certain time frame. In addition, said computer control CU and/or said software might keep track of the substrate holder or chuck which was cleaned last, and start with the other one next time.

Also, to prevent bacteria growth on or near the substrate holder or the chuck, preferably during idle time of the apparatus, the substrate holder or chuck can be flushed continuously with the immersion liquid, for example with ultra pure water (UPW). Preferably, puddles of not-moving water which are exposed to air are avoided. In addition, said radiation source SO might be switched on for a certain period of time during the flushing with the water, which can provide a UV-light induced ozone cleaning of the substrate holder or chuck. Such an ozone cleaning can be effective for chemical contamination with an organic nature such as spilled resist and to "kill" bacteria, During such a cleaning procedure, preferably, a bare substrate or substrate shaped object is present on the substrate holder under treatment.

For example, during idle time of the apparatus, each substrate holder or chuck can be continuously flushed with UPW water to decrease particle contamination and to avoid bacteria growth. Preferably, the immersion liquid is running at all times.

Also, during idle time, the radiation source SO light might be used to perform an in-situ cleaning, particularly when the source is an UV-light radiation source. Ozone generated in the water is an effective means to remove organic and bacteria growth.

Also, bare dummy substrates, or objects with similar geometry to a bare wafer, can be placed on the substrate holder WT during said idle time cleaning procedure. The immersion type apparatus can be equipped with a dedicated in-situ storage compartment 22 for the dummy substrates.

In an embodiment, there is provided a method for preventing or reducing contamination of an immersion type projection apparatus, the apparatus comprising at least one immersion space that is at least partially filled with a liquid when the apparatus projects a beam of radiation onto a substrate, the method comprising: rinsing at least part of the immersion space with a rinsing liquid before the apparatus is used to project the beam of radiation onto a substrate.

In an embodiment, the rinsing of the immersion space occurs during an idle operational mode of the apparatus. In an embodiment, the liquid and the rinsing liquid are the same liquid. In an embodiment, the rinsing of the immersion space occurs substantially continuously until the apparatus is used to project radiation onto a substrate. In an embodiment, the method further comprises illuminating at least part of the immersion space and/or the rinsing liquid with ultraviolet radiation. In an embodiment, the immersion space at least extends between at least part of a substrate, a dummy substrate or a substrate-shaped object and/or a substrate holder on one side, and a projection system on an opposite side. In an embodiment, the method further comprises: placing the dummy substrate or the substrate-shaped object on the substrate holder; and replacing the dummy substrate or the substrate-shaped object a substrate to be illuminated by the projection system after the rinsing has been completed. In an embodiment, the immersion space at least extends between a patterning device, a dummy patterning device or a patterning device-shaped object and/or a patterning device holder on one side, and a projection system on opposite side. In an embodiment, the method further comprises: placing the dummy patterning device or the patterning device-shaped object on the patterning device holder; and replacing the dummy patterning device or the patterning device-shaped object with a patterning device to be used to pattern radiation before the radiation enters the projection system. In an embodiment, the apparatus is a lithographic projection apparatus. In an embodiment, the method further comprises: varying the location of the immersion space during the rinsing of the immersion space to clean different parts and/or areas of the apparatus.

In an embodiment, there is provided a method for preventing or reducing contamination of a lithographic projection apparatus, the apparatus including a substrate holder constructed to hold a substrate, a patterning device holder constructed to hold a patterning device, a projection system, and an immersion system configured to at least partially fill an immersion space of the apparatus with a liquid, the method comprising: moving at least one of the immersion system and at least part of the apparatus relative to each other; and rinsing the at least part of the apparatus with the liquid before the apparatus is used to project a patterned beam of radiation onto a target portion of a substrate.

In an embodiment, the at least part of the apparatus comprises at least part of the substrate holder. In an embodiment, the at least part of the apparatus comprises at least one slit or aperture extending in or near the substrate holder. In an embodiment, the at least part of the apparatus comprises at least part of the patterning device holder. In an embodiment, the at least part of the apparatus comprises at least one slit or aperture extending in or near the patterning device holder.

In an embodiment, there is provided a method for preventing or reducing contamination of a lithographic projection apparatus, the apparatus including an immersion space, the method comprising: filling at least part of the immersion space with a rinsing liquid for at least one minute.

In an embodiment, the filling occurs substantially continuously for at least one day, including at least one idle operational period of the apparatus or a part thereof.

In an embodiment, there is provided a method for preventing or reducing contamination of a lithographic projection apparatus, the apparatus including a substrate holder constructed to hold a substrate, a patterning device holder constructed to hold a patterning device, a projection system, and an immersion space, the method comprising: filling at least part of the immersion space with a rinsing liquid during an idle time of the apparatus to prevent or reduce substrate contamination during at least one subsequent start-up run of the apparatus.

In an embodiment, the rinsing liquid consists of ultra pure water.

In an embodiment, there is provided an immersion type lithographic apparatus comprising: at least one immersion space; and an immersion system configured to at least partially fill the immersion space with a liquid, wherein the apparatus is configured to rinse at least part of the immersion space with a rinsing liquid before the apparatus is used to project a patterned beam of radiation onto a substrate.

In an embodiment, the apparatus is configured to rinse at least part of the immersion space during an idle operational mode of the apparatus. In an embodiment, the apparatus is configured to provide an object in the immersion space and/or in an adjoining position with respect to the immersion space during the rinsing of that space, and to remove the object before the apparatus is used to project a radiation beam onto a target portion of a substrate. In an embodiment, the apparatus further comprises at least one storage space or compartment to store the object when the apparatus is used to project a radiation beam onto a target portion of the substrate. In an embodiment, the apparatus is configured to rinse the immersion space with the liquid. In an embodiment, the apparatus is configured to rinse the immersion space substantially continuously until the apparatus projects a radiation beam onto a substrate. In an embodiment, the apparatus further comprises at least one ultra violet radiation source configured to illuminate the immersion space with ultraviolet radiation during the rinsing of that space, before the apparatus is used to project a radiation beam onto a target portion of a substrate. In an embodiment, the immersion space extends between at least part of a substrate, a dummy substrate, a substrate-shaped object and/or a substrate holder on one side and part of a projection system of the apparatus on an opposite side. In an embodiment, the apparatus is configured to place the dummy substrate or the substrate-shaped object on the substrate holder, and to subsequently rinse the respective immersion space. In an embodiment, the apparatus is configured to have the immersion space at least reach or include an outer contour of the substrate, the dummy substrate or the substrate-shaped object, being held by the substrate holder, during the rinsing. In an embodiment, the apparatus is configured to rinse at least an area extending along an edge of a substrate, a dummy substrate or a substrate-shaped object, being held by a substrate holder, using the immersion space and the rinsing liquid. In an embodiment, the apparatus is configured to rinse at least part of a surface of the substrate holder and/or one or more components that are located on that surface using the immersion space and the rinsing liquid. In an embodiment, the components are selected from the group consisting of an edge seal member, a sensor, a positioning device, and a mirror element. In an embodiment, the apparatus further comprises at least two substrate holders, wherein the immersion space extends between at least part of at least one of the substrate holders on one side and a projection system on an opposite side, and wherein the apparatus is configured to move each substrate holder to a first position and to a respective second position, away from the projection system. In an embodiment, the apparatus is configured to subsequently move the substrate holders to the first position, to be at least partially rinsed in or near that position by the rinsing liquid. In an embodiment, the apparatus further comprises at least one cleaning device configured to at least partially clean at least one of the substrate holders when that substrate holder is in the second position. In an embodiment, the apparatus is configured to determine which of the substrate holders is most likely to be contaminated and to rinse or clean the substrate holder that has been found to be most likely contaminated, first. In an embodiment, the immersion space at least extends between a patterning device and/or patterning device holder on one side and a projection system on an opposite side. In an embodiment, the apparatus is configured to place a dummy patterning device or a patterning device-shaped object on the patterning device holder, and to subsequently rinse the immersion space. In an embodiment, the apparatus is configured to move the substrate holder with respect to the projection system during the rinsing, such that the position of the immersion space changes with respect to the substrate holder during the rinsing. In an embodiment, the apparatus is configured to start the rinsing automatically after a predetermined amount of idle time of the apparatus. In an embodiment, the apparatus is configured to start the rinsing automatically after a predetermined number of substrate exposures. In an embodiment, the apparatus is configured to determine or estimate whether at least part of the apparatus has reached a certain threshold amount of contamination, and to rinse the apparatus part when it has been determined or estimated that the apparatus part has reached the threshold amount of contamination. In an embodiment, the apparatus further comprises a computer control to control the rinsing.

In an embodiment, there is provided an immersion type lithographic apparatus, including at least one storage space or compartment to store at least one dummy substrate or substrate-shaped object in-situ.

In an embodiment, there is provided an immersion type lithographic apparatus, including at least one storage space or compartment to store at least one dummy patterning device or patterning device-shaped object in-situ.

In an embodiment, there is provided a computer program containing one or more sequences of machine-readable instructions configured to carry out a method for preventing or reducing contamination of an immersion type projection apparatus when the computer program is being executed by a computer, the apparatus comprising at least one immersion space that is at least partially filled with a liquid when the apparatus projects a beam of radiation onto a substrate, the method comprising rinsing at least part of the immersion space with a rinsing liquid before the apparatus is used to project the beam of radiation onto a substrate.

In an embodiment, there is provided a method for preventing or reducing contamination of a lithographic projection apparatus comprising a space that is to be provided with a liquid through which a beam of radiation can be transmitted, the method comprising: operating the lithographic apparatus; and subsequently rinsing at least part of the space with a rinsing liquid.

In an embodiment, the liquid and the rinsing liquid are the same liquid.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultra-violet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the present invention may be applied to any immersion lithographic apparatus, such as those types mentioned above, and whether the immersion liquid is provided in the form of a bath or only on a localized surface area of the substrate. An immersion system can be any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the immersion liquid to the space. In an embodiment, a surface of the space may be limited to a portion of the substrate and/or substrate table, a surface of the space may completely cover a surface of the substrate and/or substrate table, or the space may envelop the substrate and/or substrate table.

Also, an immersion system can be any mechanism that provides a liquid to a space between the projection system and the patterning device and/or patterning device support.

The descriptions above are intended to be illustrative, not limiting. Thus, it will be apparent to one skilled in the art that modifications may be made to the invention as described without departing from the scope of the claims set out below.

What is claimed is:

1. A lithographic projection apparatus arranged to project a pattern, through an immersion liquid, from a patterning device onto a substrate using a projection system, the lithographic projection apparatus comprising:

a movable table, a surface of the movable table comprising a component, the component being one or more selected from the following: a sensor, a positioning device, a gap between the table and an object on the table, or a mirror element;

an immersion system configured to at least partly fill an immersion space between the projection system and the table with the immersion liquid; and a computer control configured to cause rinsing of a surface of the apparatus, the surface comprising the surface of the table and a surface of the component, with a rinsing liquid by causing movement of the table relative to the projection system at a time other than when the apparatus is used to project the pattern onto the substrate and by causing the rinsing liquid to continuously flow over the surface; and control movement of the movable table, wherein movements during projecting the pattern through the immersion liquid from the patterning device onto the substrate are different from movements during the rinsing of the surface of the apparatus.

2. The apparatus of claim 1, wherein the computer control is configured to cause the rinsing to occur during an idle operational mode of the apparatus.

3. The apparatus of claim 1, wherein the immersion liquid and the rinsing liquid comprise the same type of liquid.

4. The apparatus of claim 1, wherein the computer control is configured to cause the rinsing to occur substantially continuously when the apparatus is operational but not used to project the pattern onto the substrate.

5. The apparatus of claim 1, wherein the computer control is configured to cause at least part of the surface, the component or the rinsing liquid to be illuminated with ultraviolet radiation.

6. The apparatus of claim 1, wherein the computer control is configured to cause a dummy substrate or a substrate-shaped object to be placed on the table, and to cause the dummy substrate or the substrate-shaped object to be replaced with the substrate to be illuminated by the projection system after the rinsing has been completed.

7. The apparatus of claim 1, wherein the computer control is configured to cause the location of a part or area of the apparatus be varied with respect to the immersion space during the rinsing to clean the part or area.

8. A method of controlling an apparatus comprising an immersion space that is at least partially filled with an immersion liquid when the apparatus projects a beam of radiation onto a substrate, and a projection system at least partially defining the immersion space and a table movable to be in or to at least partly define the immersion space, the method comprising:

preventing or reducing contamination of the apparatus by rinsing a surface of the apparatus, the surface comprising a surface of the table and a surface of a component located on the table, with a rinsing liquid by moving the table relative to the projection system at a time other than when the apparatus is used to project the beam of radiation onto the substrate and by providing a continuous flow of the rinsing liquid over the surface, the component being one or more selected from the following: a sensor, a positioning device, a gap between the table and an object on the table, or a mirror element; and controlling movement of the table, wherein movements during projection of the beam of radiation onto the substrate are different from movements during the rinsing of the surface of the apparatus.

9. The method of claim 8, wherein the rinsing occurs during an idle operational mode of the apparatus.

10. The method of claim 8, wherein the immersion liquid and the rinsing liquid comprise the same type of liquid.

11. The method of claim 8, wherein the rinsing occurs substantially continuously when the apparatus is operational but not used to project the beam of radiation onto the substrate.

12. The method of claim 8, further comprising illuminating at least part of the surface, the component, or the rinsing liquid with ultraviolet radiation.

13. The method of claim 8, further comprising:

placing a dummy substrate or a substrate-shaped object on the table; and replacing the dummy substrate or the substrate-shaped object with the substrate to be illuminated by the projection system after the rinsing has been completed.

14. The method of claim 8, further comprising varying the location of a part or area of the apparatus with respect to the immersion space during the rinsing to clean the part or area.

* * * * *